United States Patent
Dow et al.

(10) Patent No.: US 10,543,510 B2
(45) Date of Patent: Jan. 28, 2020

(54) METHOD FOR MODIFYING SURFACE OF NON-CONDUCTIVE SUBSTRATE AND SIDEWALL OF MICRO/NANO HOLE WITH RGO

(71) Applicant: NATIONAL CHUNG HSING UNIVERSITY, Taichung (TW)

(72) Inventors: Wei-Ping Dow, Taichung (TW); Wei-Yang Zeng, Taichung (TW); Yi-Yung Chen, Taichung (TW)

(73) Assignees: NATIONAL CHUNG HSING UNIVERSITY, Taichung (TW); TRIALLIAN CORPORATION, New Taipei (TW); Albert Yeh, New Taipei (TW)

( * ) Notice: Subject to any disclaimer, the term of this patent is extended or adjusted under 35 U.S.C. 154(b) by 330 days.

(21) Appl. No.: 15/613,048

(22) Filed: Jun. 2, 2017

(65) Prior Publication Data
US 2018/0036769 A1 Feb. 8, 2018

(30) Foreign Application Priority Data
Aug. 4, 2016 (TW) .............................. 105124838 A

(51) Int. Cl.
| | |
|---|---|
| B05D 7/22 | (2006.01) |
| H01L 21/02 | (2006.01) |
| H01L 29/16 | (2006.01) |
| H01L 29/66 | (2006.01) |
| B05D 7/24 | (2006.01) |
| C09D 5/24 | (2006.01) |
| C09D 7/61 | (2018.01) |
| C08G 73/02 | (2006.01) |
| H05K 3/42 | (2006.01) |
| C09D 1/00 | (2006.01) |
| C09D 179/02 | (2006.01) |
| B05D 7/00 | (2006.01) |
| C08K 3/04 | (2006.01) |

(52) U.S. Cl.
CPC .................. *B05D 7/22* (2013.01); *B05D 7/24* (2013.01); *B05D 7/54* (2013.01); *B05D 7/58* (2013.01); *C08G 73/0286* (2013.01); *C09D 1/00* (2013.01); *C09D 5/24* (2013.01); *C09D 7/61* (2018.01); *C09D 179/02* (2013.01); *H01L 21/02104* (2013.01); *H01L 21/02365* (2013.01); *H01L 21/02376* (2013.01); *H01L 21/02505* (2013.01); *H01L 21/02527* (2013.01); *H01L 21/02658* (2013.01); *H01L 29/1606* (2013.01); *H01L 29/66015* (2013.01); *H05K 3/422* (2013.01); *B05D 2350/30* (2013.01); *B05D 2401/20* (2013.01); *B05D 2505/00* (2013.01); *C08K 3/042* (2017.05)

(58) Field of Classification Search
CPC ... B05D 7/22; B05D 7/24; B05D 7/54; B05D 7/58; B05D 2350/30; B05D 2401/20; B05D 2505/00; H01L 21/02104; H01L 21/02365; H01L 21/02505; H01L 21/02376; H01L 21/02527; H01L 21/02658; H01L 21/1057; H01L 29/1606; H01L 29/66015
See application file for complete search history.

(56) References Cited

U.S. PATENT DOCUMENTS

| | | | |
|---|---|---|---|
| 5,389,270 A | 2/1995 | Thorn et al. | |
| 8,884,310 B2 | 11/2014 | Seacrist et al. | |
| 9,105,696 B1 * | 8/2015 | Dow | H01L 21/02057 |
| 9,343,533 B2 | 5/2016 | Seacrist et al. | |

FOREIGN PATENT DOCUMENTS

| | | | |
|---|---|---|---|
| CN | 105155253 A | * | 12/2015 |
| WO | 2013/096273 A1 | | 6/2013 |

* cited by examiner

*Primary Examiner* — William P Fletcher, III
(74) *Attorney, Agent, or Firm* — Pai Patent & Trademark Law Firm; Chao-Chang David Pai

(57) ABSTRACT

Non-conductive substrates, especially the sidewalls of micro/nano holes thereof are chemically modified (i.e., chemically grafted) by reduced graphene oxide (rGO). The rGO possesses excellent electrical conductivity and therefore the modified substrates become conductive, so that it can be directly electroplated. These rGO-grafted holes can pass thermal shock reliability test after electroplating. The rGO grafting process possesses many advantages, such as a short process time, no complex agent (i.e., no chelator), no toxic agents (i.e., formaldehyde for electroless Cu deposition). It is employed in an aqueous solution instead of an organic solvent, and therefore is environmentally friendly and beneficial for industrial production.

10 Claims, 13 Drawing Sheets
(12 of 13 Drawing Sheet(s) Filed in Color)

front side  back side front side  back side front side (PVI)  back side (PVI)

front side (PAE)  back side (PAE)

front side (Gemini)  back side (Gemini)

front side (PACD)  back side (PACD)

front side (PDACH)

back side (PDACH)

front side (PQT-2)

back side (PQT-2)

METHOD FOR MODIFYING SURFACE OF NON-CONDUCTIVE SUBSTRATE AND SIDEWALL OF MICRO/NANO HOLE WITH RGO

CROSS-REFERENCE TO RELATED APPLICATIONS

The present application claims benefit of priority of the Taiwan Patent Application No. 105124838, filed Aug. 4, 2016. The entirety of said Taiwan application is incorporated by reference herein.

STATEMENT REGARDING PRIOR DISCLOSURES BY THE INVENTOR

The subject matter of the present invention was previously disclosed in the Master's Thesis entitled "Research and Development of Graphene for Direct Plating Technology", by Wei-Yang Zeng under the guidance of Dr. Wei-Ping Dow, presented Jun. 7, 2016, at National Chung Hsing University, Taichung, Taiwan. Both Wei-Yang Zeng and Wei-Ping Dow are named joint inventors of the present application. The said Master's Thesis, a copy of which is being submitted as attachment to the present application, is a grace period inventor disclosure under 35 U.S.C. 102(b)(1)(A).

BACKGROUND OF THE INVENTION

1. Field of the Invention

The present invention relates a method for modifying (grafting) surfaces of a substrate and sidewalls of high-aspect holes with reduced graphene oxide (rGO) by a wet process.

2. Related Prior Art

U.S. Pat. No. 5,389,270A disclosed a composition beneficial to uniformly dispose graphite on sidewall surfaces of non-conductive through holes as a conducting layer for electroplating process. The composition consists essentially of an aqueous dispersing medium, graphite having a micrometer particle size, a dispersing agent for dispersing the graphite particles, a binding agent for binding the graphite particles to the sidewall surfaces of the non-conductive through holes, and a surfactant for wetting the through hole.

Before electroplating, a fixing solution is preferably applied to remove redundant graphite particles in the through holes and to smooth the graphite coating on the sidewall of the through holes. The fixing solution may either be water or a dilute acid.

Patent WO 2013/096273 disclosed a graphene layer as a barrier layer between a first metal layer and a second metal layer. The graphene layer is formed on a template layer of Cu or Ni by chemical vapor deposition and then transferred to a surface of the second metal layer.

U.S. Pat. Nos. 8,884,310B2 and 9,343,533 disclosed a method for directly forming graphene on semiconductor substrates. This method comprises steps of: (a) depositing a layer comprising a carbon-rich polymer on the front surface of the semiconductor substrate; (b) forming a metal film on the carbon-rich polymer layer by sputtering, evaporation, electroplating or metal foil bonding; (c) heating the semiconductor substrate (500° C.-1000° C.) to drive carbon to diffuse into the subsequently applied metal film; (d) precipitating carbon atoms to form a layer of graphene on the surface of the semiconductor substrate by rapidly cooling the semiconductor substrate; and (e) etching the metal film away to render graphene on silica-on-silicon substrate.

U.S. Pat. No. 9,105,696 disclosed a method for coating a layer of reduced graphene oxide (rGO) on the surface of substrate holes. This method includes: (Step 1) hydrophilic treatment of the surface of the substrate; (Step 2) forming a self-assembly silane layer on the surface of the substrate and the holes; (Step 3) grafting a polymer layer on the self-assembly silane layer; (Step 4) immersing the treated substrate from Step 3 in an alkaline GO solution to graft a GO layer on the polymer layer; (Step 5) immersing the treated substrate from Step 4 in a solution of metal ion to intercalate the metal ions into the GO layer; and (Step 6) immersing the treated substrate from Step 5 in a solution of reductant to reduce the metal ion into metal atom, and the GO layer into a reduced graphene oxide (rGO) layer to form a metal atom/rGO composite layer on the substrate surface and the hole surface.

SUMMARY OF THE INVENTION

An object of the present invention is to modify surfaces of a non-conductive substrate and sidewalls of micro/nano holes with reduced graphene oxide (rGO). Furthermore, the three-step process of this invention and the conditioner employed therein are simpler than those disclosed in U.S. Pat. No. 9,105,696.

In the specification, the term "substrate" means a semi-conductive or non-conductive substrate including micro/nano blind vias or through holes having high aspect ratios. Surfaces of the substrate and sidewalls of the holes will be modified to possess electrical conductivity for the sequential electroplating process.

The method includes steps of: (a) contacting a substrate with an aqueous solution of a conditioner including an amino compound at 40-80° C. for 3-10 minutes to form a layer of the amino compound on surfaces of the substrate and sidewalls of the holes, wherein the amino compound has a concentration of 0.1-3 g/L; (b) contacting the substrate with a graphene oxide (GO) solution for 5-10 minutes to bond the GO with the amino compound, wherein the GO solution has a pH value of 3-6, a temperature of 35-80° C. and a solid content of 0.1-1 g/L; and (c) contacting the substrate with a solution containing a reducing agent at 60-90° C. for 5-10 minutes to reduce the GO and modify the surfaces of the substrate with the reduced GO (rGO), wherein the solution with the reducing agent has a pH value of 3-10 and a concentration of 0.5-2M.

The conditioner includes deionized water and an amino compound added into the deionized water, wherein the amino compound has a concentration of 0.3 g/L-1 g/L. The conditioner is employed in the process for grafting graphene oxide (GO) onto surfaces of a substrate and sidewalls of high-aspect holes, whereby a layer of amino compound can be formed on the surfaces of the substrate and the sidewalls of the holes to chemically bond a layer of GO.

The amino compound can be polyamines or alkamines, wherein the polyamines preferably have quaternary ammonium functional groups.

Advantages of this invention include:

a. The rGO can be firmly bonded on surfaces of the substrate and sidewalls of the holes whereby conductivity thereof is stable and beneficial for electroplating.

b. The modifying process can be achieved within 30 minutes.

c. The conditioner can be made easily.

d. No toxic chemicals and organic solvent are used so that the waste solution can be treated easily.

e. The process is carried out at ordinary temperature and pressure which facilitate industrial mass production.

f. The substrate after filling holes with electroplated metal can satisfy thermal shock tests since the rGO possesses excellent properties in mechanical strength, thermal conductivity, electrical conductivity and shape.

BRIEF DESCRIPTION OF THE DRAWINGS

The patent or application file contains at least one drawing executed in color. Copies of this patent or patent application publication with color drawings will be provided by the Office upon request and payment of the necessary fee.

Figure 1:
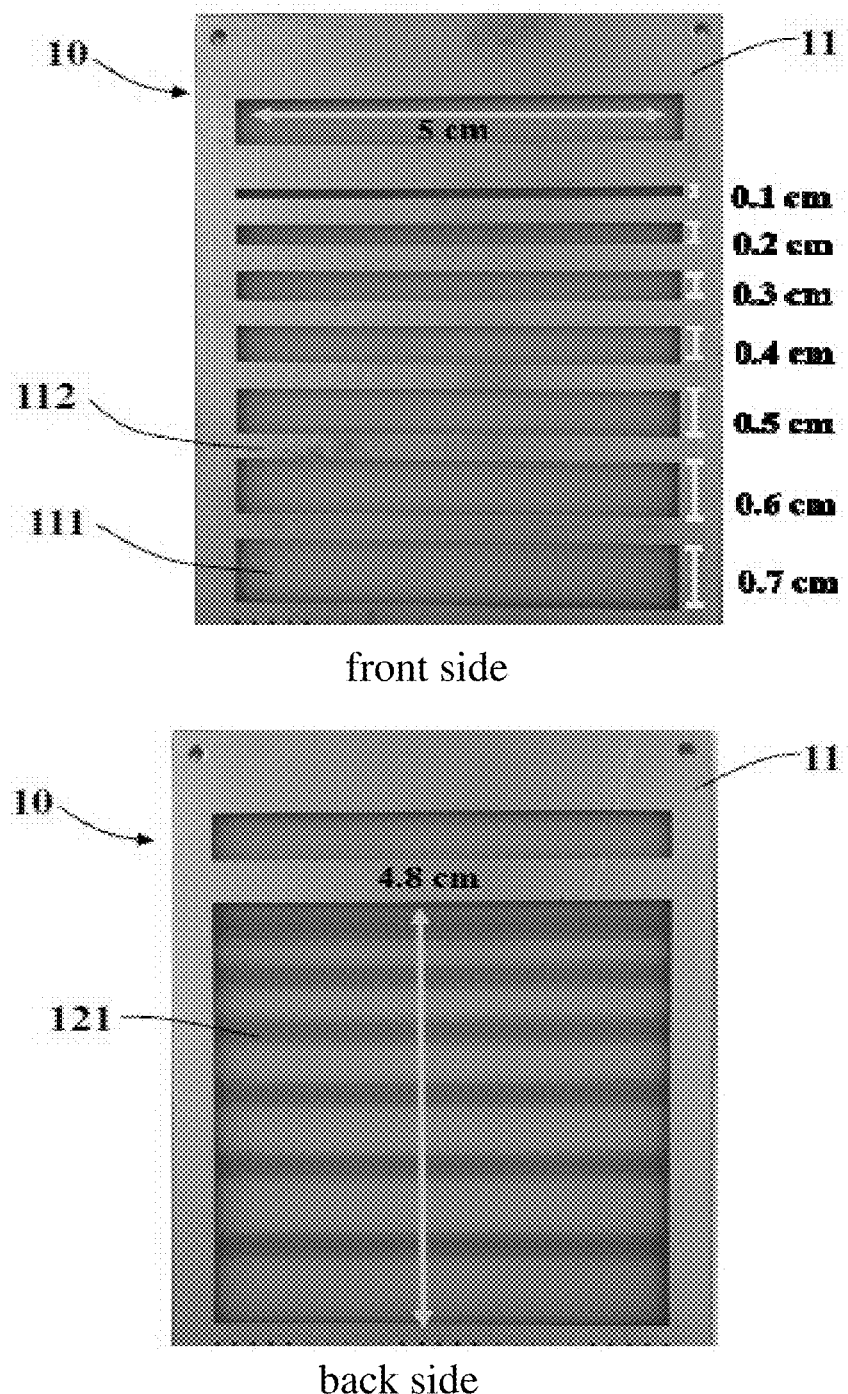
FIG. 1 shows the substrate for the over plating test of Example 1.

Reference Characters in the drawings are listed below:

| Substrate 10 | front side 11 | non-conductive strips 111 |
|---|---|---|
| conductive area 112 | back side 12 | non-conductive area 121 |

DETAILED DESCRIPTION OF THE PREFERRED EMBODIMENTS

EXAMPLE 1

The method for modifying surfaces of an non-conductivesubstrate and sidewalls of micro/nano holes with reduced graphene oxide (rGO) includes the following steps.

(a) Contact a substrate with an aqueous conditioner solution including an amino compound at 40-80° C. for 3-10 minutes to form a layer of the amino compound on the surface of the substrate and sidewalls of the holes. The amino compound has a concentration of 0.1-3 g/L.

(b) Contact the substrate with a graphene oxide (GO) solution for 5-10 minutes to chemically bond the GO with the amino compound. The GO solution has a pH value of 3-6, a temperature of 35-80° C. and a solid content of 0.1-1 g/L. Preferably, the substrate is immersed in the GO solution for 10 minutes using ultrasonic vibration for 5 seconds. The GO solution preferably has a pH value of 3.5-4.5, a temperature of 60° C. and a solid content of 0.25-0.5 g/L. The substrate is then rinsed by deionized water and dried with nitrogen gas. According to this procedure, the negative-charged oxide functional groups on the graphene oxide are physically adsorbed and chemically bonded to the amino compound layer.

(c) Contact the substrate with a reducing agent solution at 60-90° C. for 5-10 minutes to reduce the GO and modify the surfaces of the substrate with the reduced GO (rGO), wherein the solution of the reducing agent has a pH value of 2-10 and a concentration of 0.2-2M. Preferably, the substrate is immersed in the solution of the reducing agent for 10 minutes using ultrasonic vibration for 5 seconds. The solution preferably has a pH value of 10, a temperature of 60° C. and a concentration of 1M. The substrate is then rinsed by deionized water and dried with nitrogen gas. According to this procedure, the GO is reduced to reduced GO (rGO), whereby the surfaces of the substrate and sidewalls of the holes possess electrical conductivity.

The amino compound of step (a) can be either polyamines or alkamines.

The polyamines can have a structural formula (1).

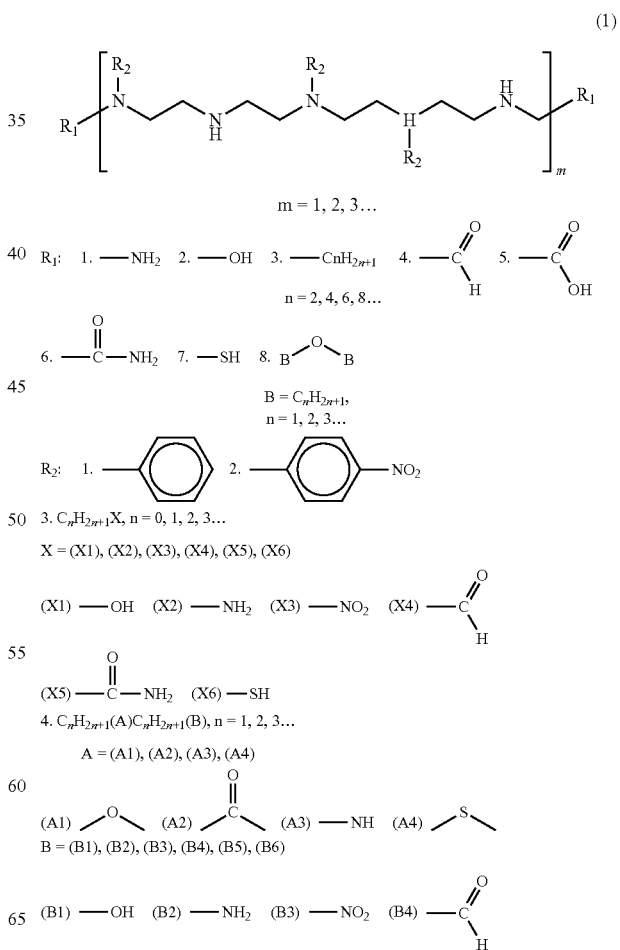

-continued (B5) —C(=O)—NH₂  (B6) —SH

5. $C_nH_{2n+1}[C_nH_{2n+1}Y]$ n = 1, 2, 3...

Y = (Y1), (Y2), (Y3), (Y4), (Y5), (Y6)

(Y1) —OH  (Y2) —NH₂  (Y3) —NO₂  (Y4) —C(=O)H (Y5) —C(=O)—NH₂  (Y6) —SH

The alkamines can have a formula either (2) or (3).

$$NH_{3-m}(C_2H_4)_m(OH)_m, \quad m=1, 2 \text{ or } 3 \quad (2)$$

$$N_n(C_2H_4)_{2n+1}(OH)_{2n+1}, \quad n=2, 3 \text{ or } 4 \quad (3)$$

The polymer bearing a quaternary ammonium group is selected from the group consisting of quaternary polyvinylimidazole (PVI), polyamidoamine-epichlorohydrin (PAE), hyperbranched gemini quaternary ammonium salt, poly(acrylamide-co-diallyldimethylammonium chloride) (PACD), poly(diallyldimethylammonium chloride) (PDACH) and polyquaternium-2.

The reducing agent can be inorganic or organic. The inorganic reducing agent can be but is not limited to SnCl₂, NaHPO₄, NaBH₄ or HI. The organic reducing agent can be but is not limited to N₂H₄, vitamin C, urea, heparin, amino acid, garlic acid, microorganisms, glucose, fructose, protein, peptides, hormones, neurotransmitters, extract of plant, quaternary ammonium compound or precursors of conductive polymers. The amino acid can be but is not limited to cysteine, lysine or aspartic acid. The microorganism can be but is not limited to Shewanella. The protein and peptide can be but is not limited to Bovine serum albumin. The hormones can be but is not limited to melatonin. The neurotransmitters can be but is not limited to dopamin. The extract of plant can be but is not limited to spinach, tea or garlic. The precursor of conductive polymer can be but is not limited to pyrrole, thiophene or aniline. Vitamin C is used as the organic reducing agent in Examples of this invention.

EXAMPLE 2

(a) Contact a substrate with an aqueous conditioner solution containing a quaternary ammonium polymer and alkamine at 40-80° C. for 5-20 minutes, and preferably at 60° C. for 10 minutes. The solvent is deionized (DI) water. The quaternary ammonium polymer has a concentration of 0.5-3 g/L, and preferably 1 g/L. The alkamine has a concentration of 10-50 g/L, and preferably 30 g/L. Furthermore, the conditioner includes a surfactant in a concentration of 25-200 ppm, preferably 50 ppm. Preferably, the substrate is immersed in the conditioner at 60° C. for 10 minutes using ultrasonic vibration for 5 seconds. The substrate is then rinsed by DI water and dried with nitrogen gas.

(b) The procedure is the same as (b) of Example 1.

(c) The procedure is the same as (c) of Example 1.

In step (a), the alkamine and surfactant are added to clean the surfaces of the substrate and sidewalls of the holes to remove grease and impurities. Thereby a uniform layer of quaternary ammonium polymer can be formed on surfaces of the substrate and sidewalls of the holes. The alkamine has a formula (2) or (3) aforementioned, for example, ethylamine, diethanolamine and triethanolamine. The quaternary ammonium polymer is selected from the group consisting of quaternary polyvinylimidazole (PVI), polyamidoamine-epichlorohydrin (PAE), hyperbranched gemini quaternary ammonium salt, poly(acrylamide-co-diallyldimethylammonium chloride) (PACD), poly(diallyldimethylammonium chloride) (PDACH) and polyquaternium-2. The surfactant can be polythylene glycol or t-Octylphenoxypolyethoxyethanol (Triton-X100).

Over Plating Experiments

FIG. 1 shows a substrate 10 provided for the over plating tests. There are seven non-conductive strips 111 with various widths on the front side 11 of the substrate 10. A copper clad conductive area 112 is formed between the non-conductive strips 111. The non-conductive strips 111 are made of resin. A non-conductive area 121 is formed over the back side 12 of the substrate 10.

Experiment 1 for the Substrate of Example 1

Figure 2:
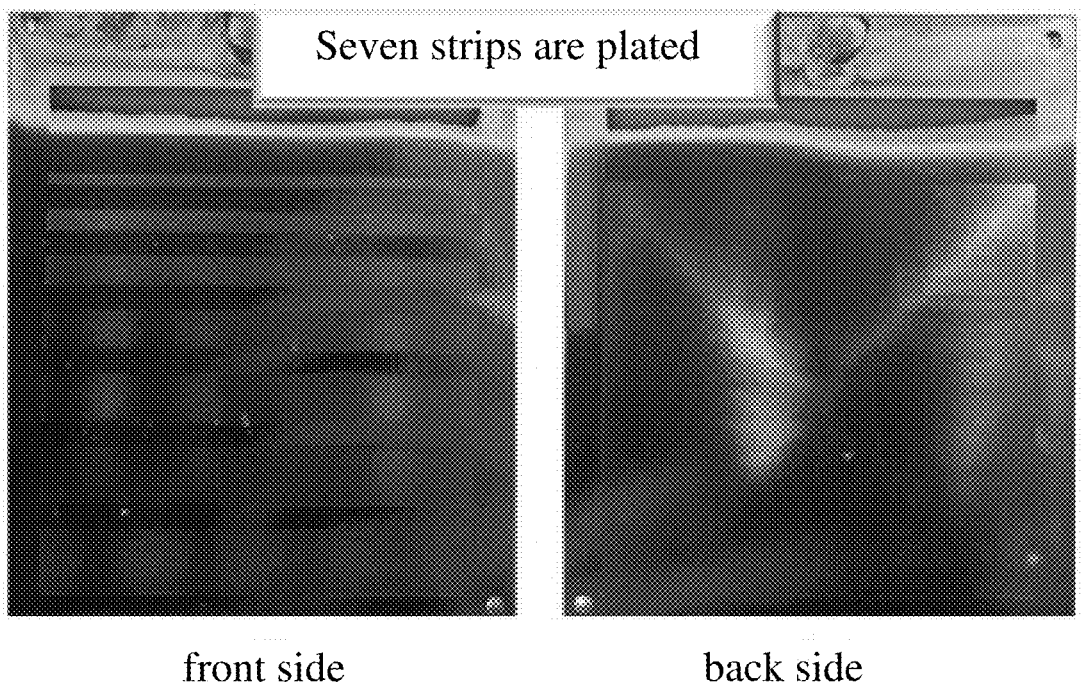
FIGS. 2 and 3 show the Cu depositions on the substrates of Example 1 wherein the conditioners are polyamines in concentrations of 1 g/L and 2 g/L, respectively.
Figure 3:
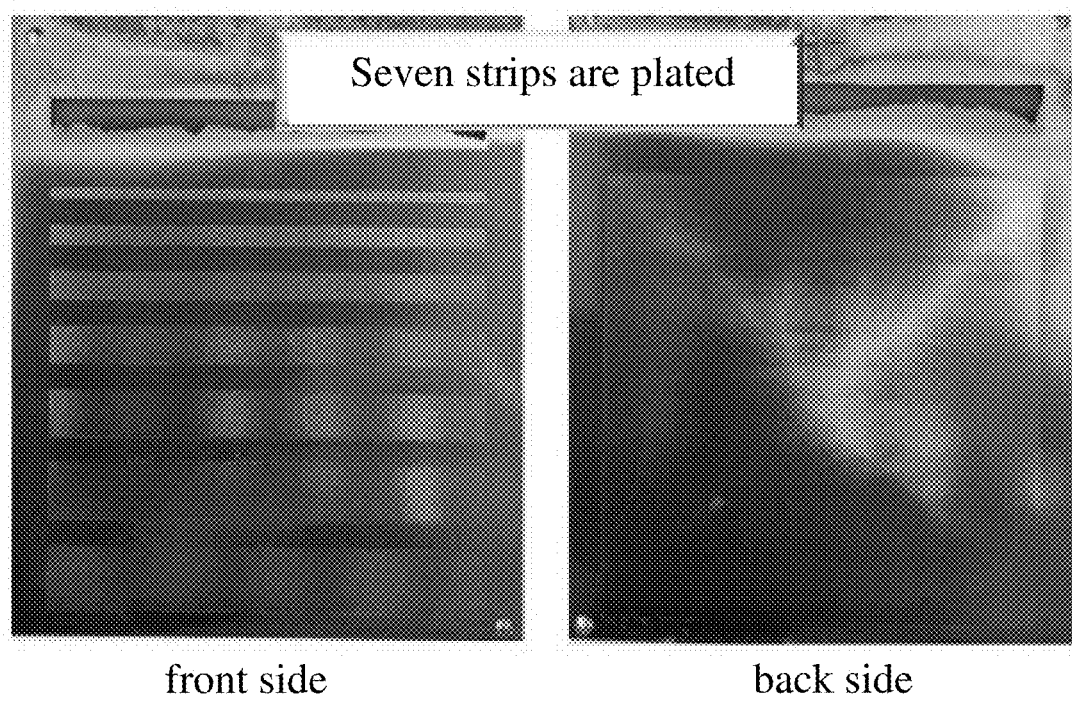

Two substrates are modified with rGO on both sides according to the method of Example 1, to which polyamines of 1 g/L and 2 g/L are respectively applied. Procedures and operating conditions for over plating are well known. FIGS. 2 (1 g/L) and 3 (2 g/L) show that the Cu depositions throughout the front sides and the back sides of the substrates are uniform and dense.

Experiment 2 for the Substrate of Example 1

Figure 4:
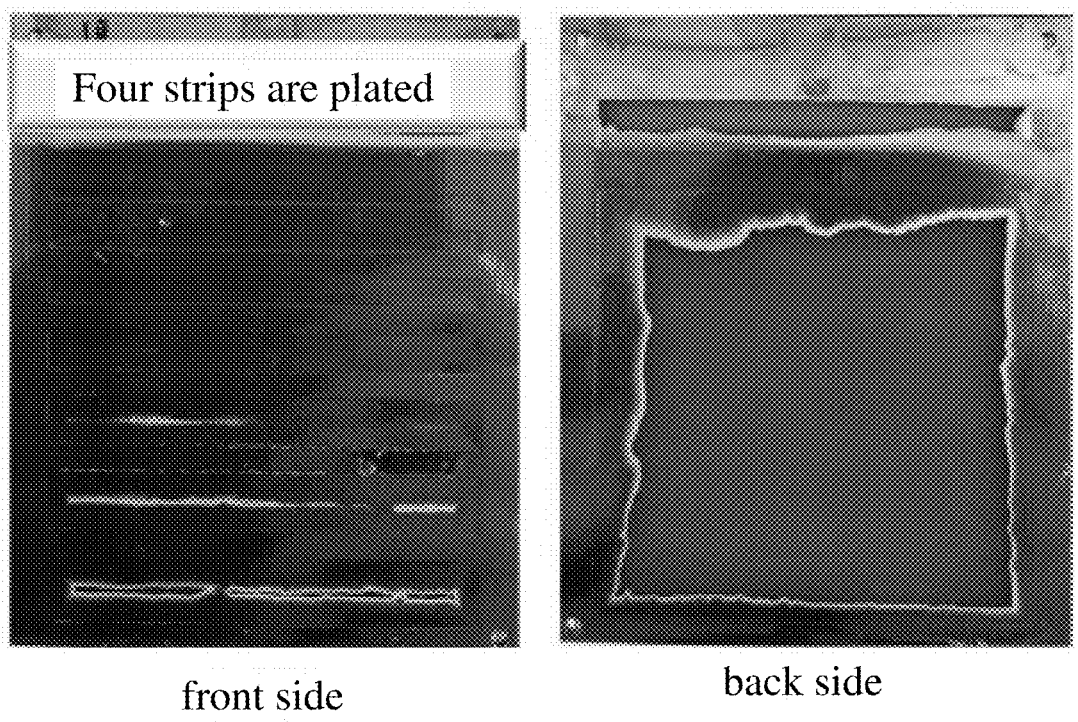
FIGS. 4 and 5 show the Cu depositions on the substrates of Example 1 wherein the conditioners are alkamines having a formula (2) in concentrations of 10 g/L and 30 g/L, respectively.
Figure 5:
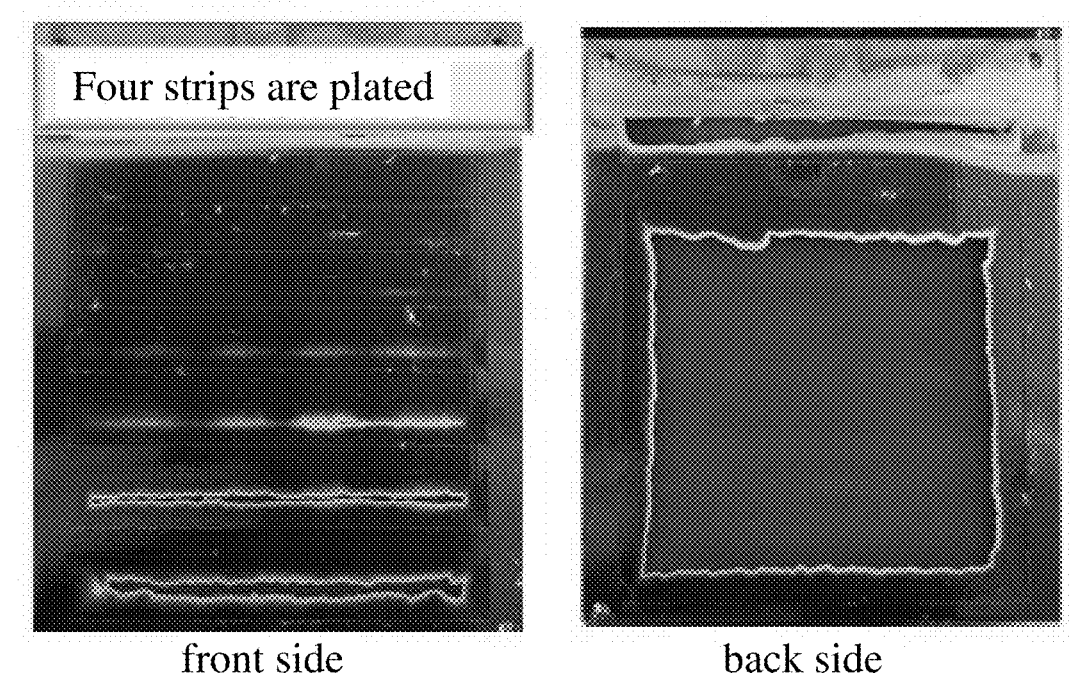

Two substrates are modified with rGO on both sides according to the method of Example 1, to which alkamine having the formula (2) of 10 g/L and 30 g/L are respectively applied. FIGS. 4 (10 g/L) and 5 (30 g/L) show that the Cu is deposited partially over the front sides and the back sides of the substrates.

Experiment 3 for the Substrate of Example 1

Figure 6:
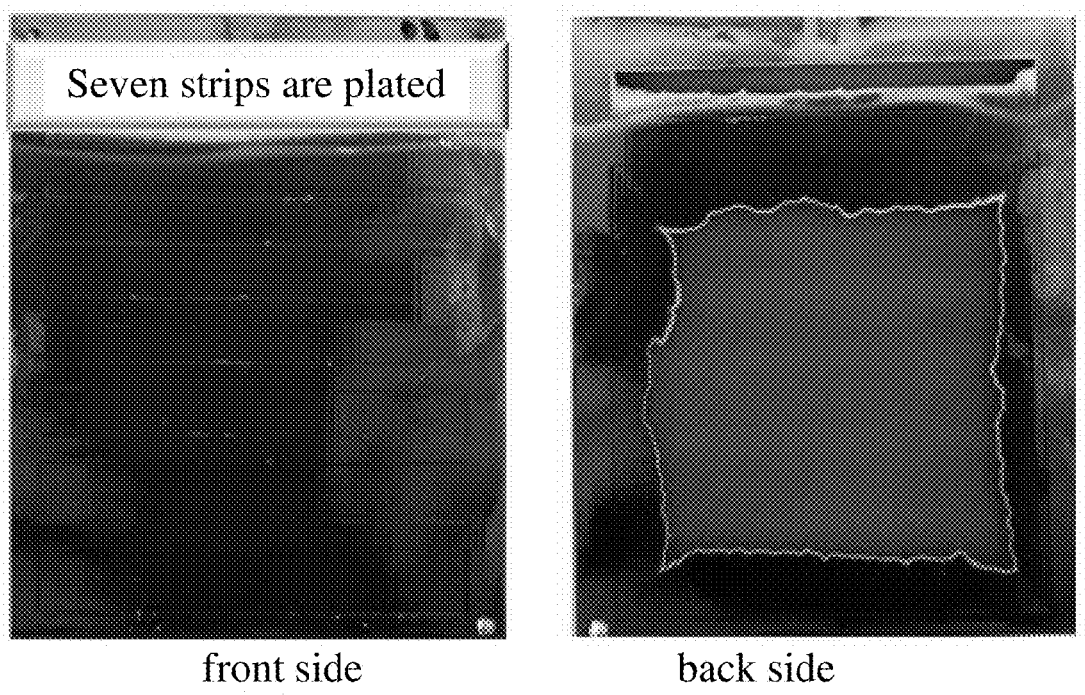
FIGS. 6 and 7 show the Cu depositions on the substrates of Example 1 wherein the conditioners are alkamines having a formula (3) in concentrations of 10 g/L and 30 g/L, respectively.
Figure 7:
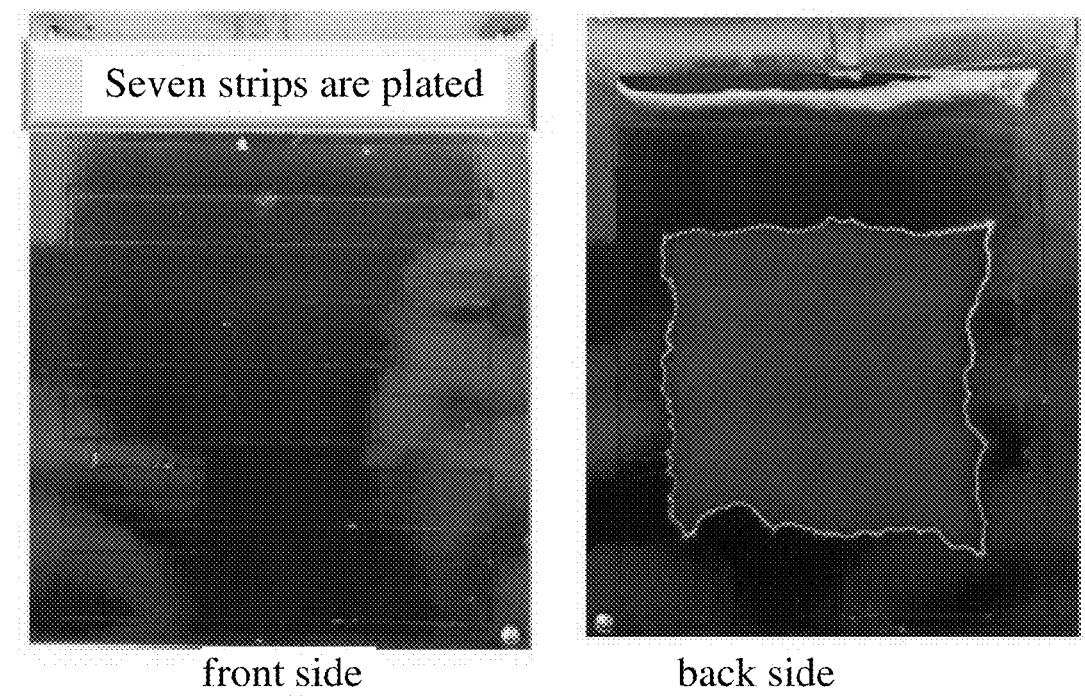

Two substrates are modified with rGO on both sides according to the method of Example 1, to which alkamine having the formula (3) of 10 g/L and 30 g/L are respectively applied. FIGS. 6 (10 g/L) and 7 (30 g/L) show that the Cu is deposited throughout the front sides and partially over the back sides of the substrates.

Experiment 4 for the Substrate of Example 1

Figure 8:
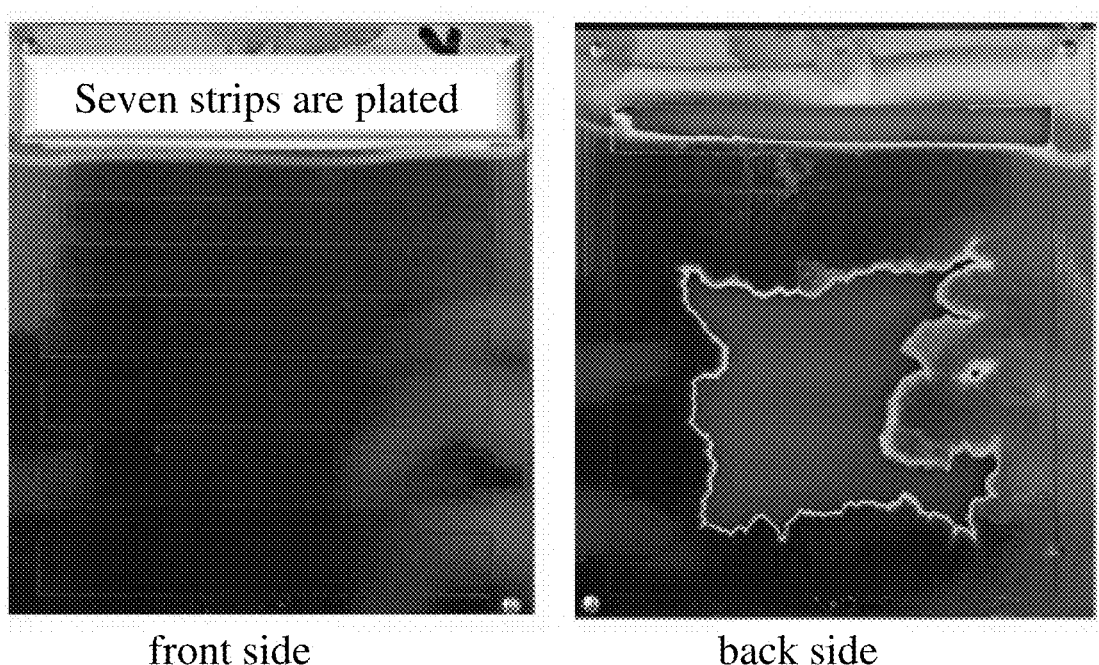
FIG. 8 shows the Cu deposition on the substrates of Example 1 wherein the conditioner is PVI in concentrations of 1 g/L.
Figure 9:
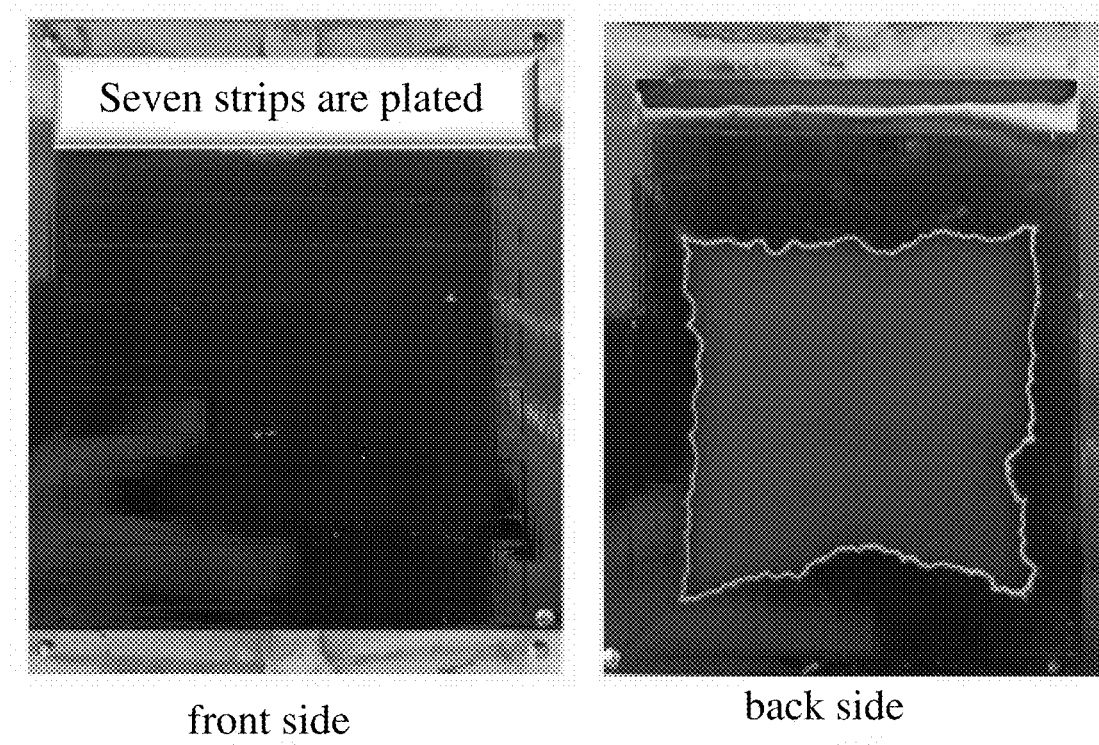
FIGS. 9 and 10 show the Cu depositions on the substrates of Example 1 wherein the conditioners are PQT-2 in concentrations of 1 g/L and 3 g/L, respectively.
Figure 10:
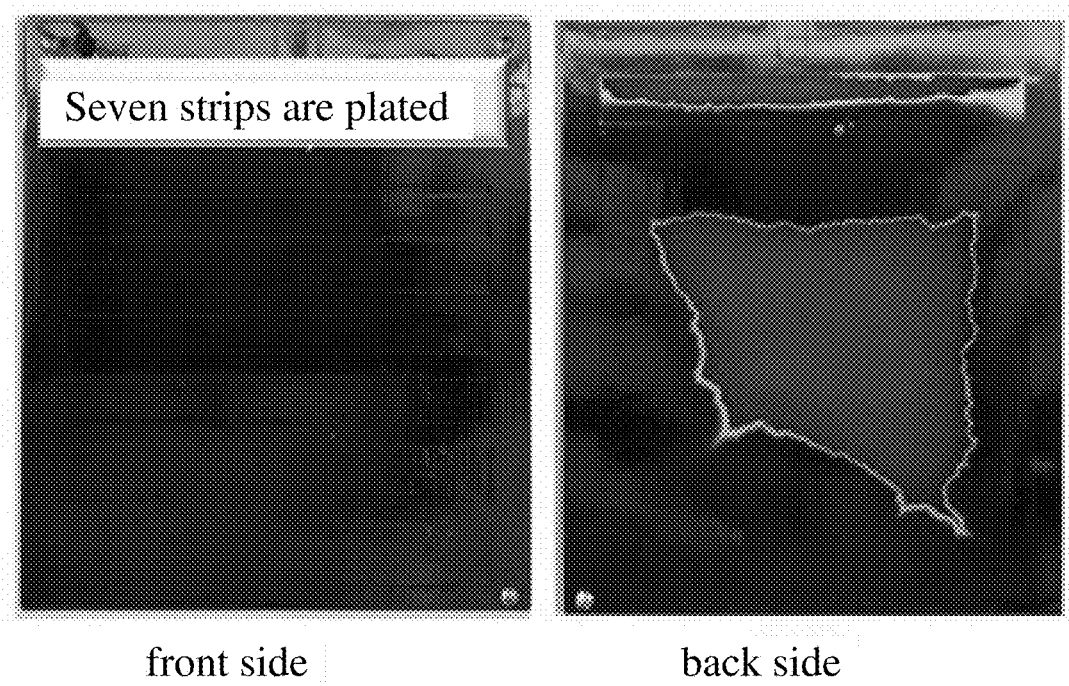
Figure 11:
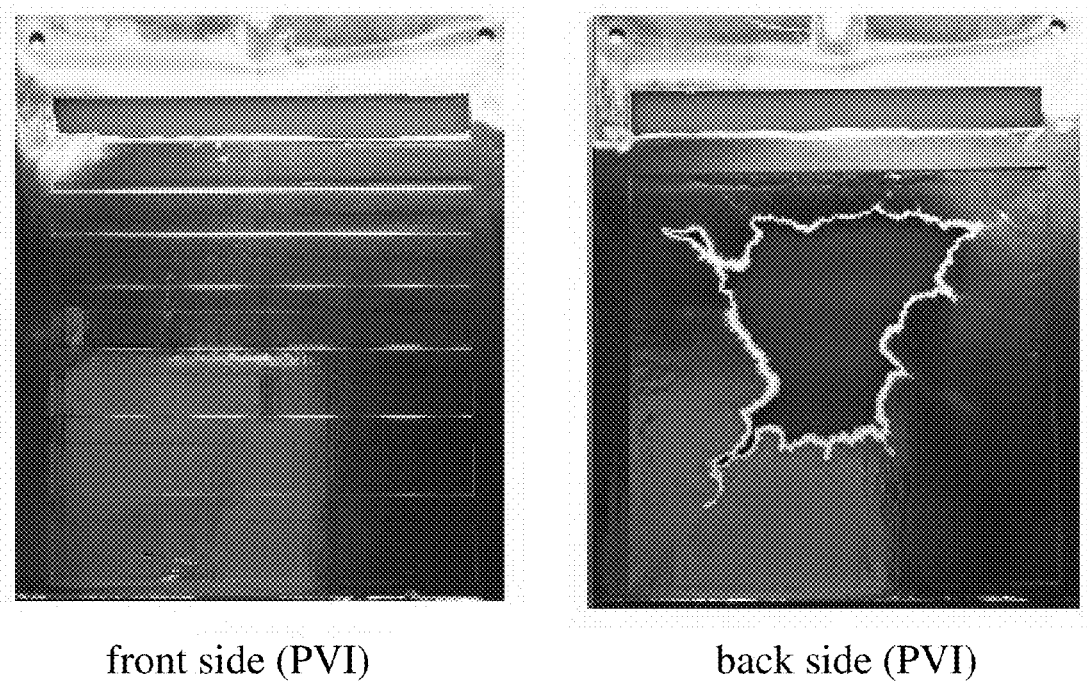
FIGS. 11-16 show the Cu depositions on the substrates of Example 2 wherein the conditioners are PVI, PAE, Gemini, PACD, PDACH and PQT-2, respectively.
Figure 12:
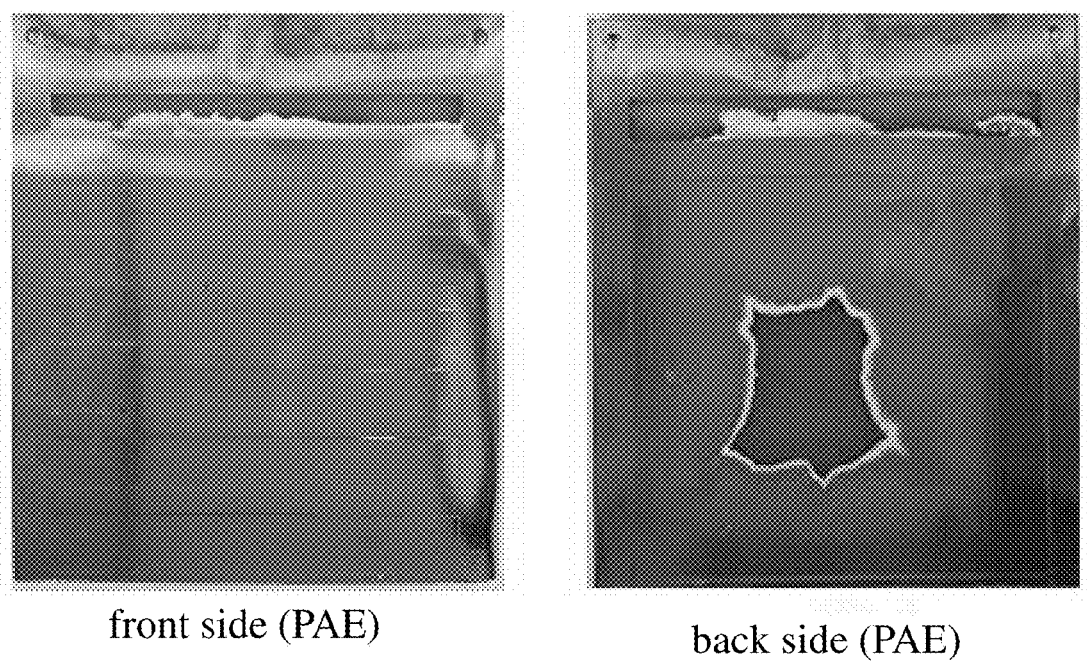
Figure 13:
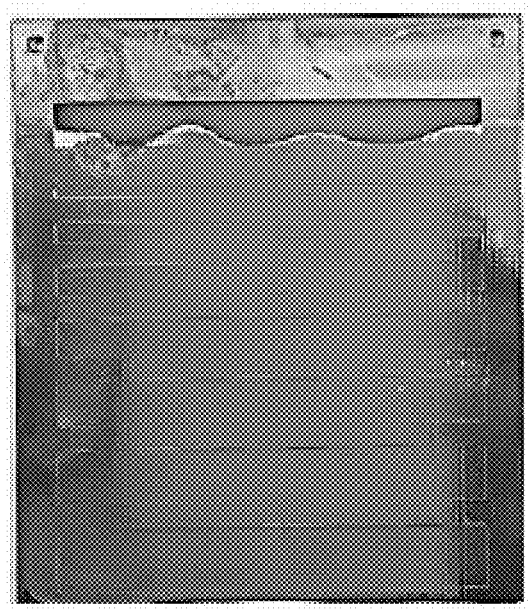
Figure 13:
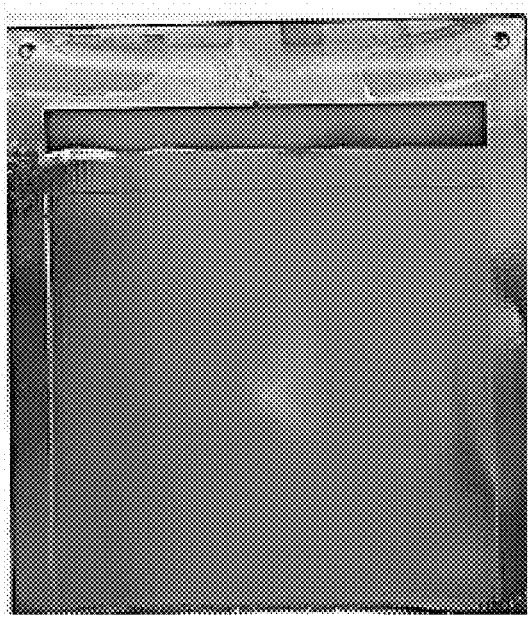
Figure 14:
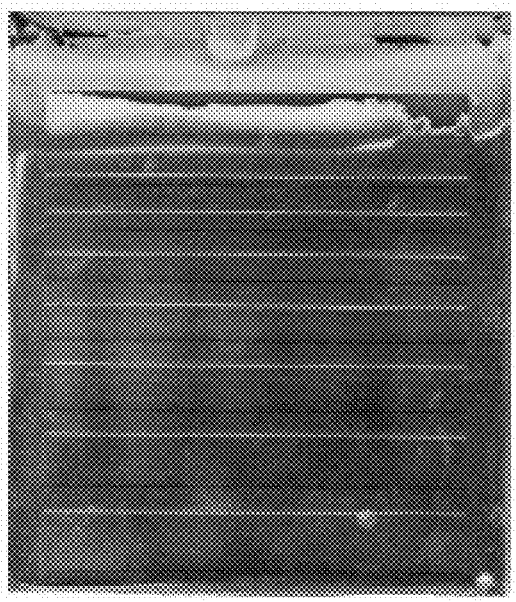
Figure 14:
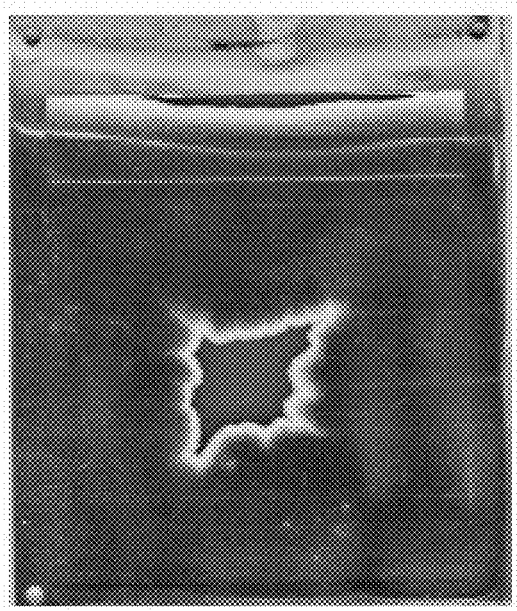
Figure 15:
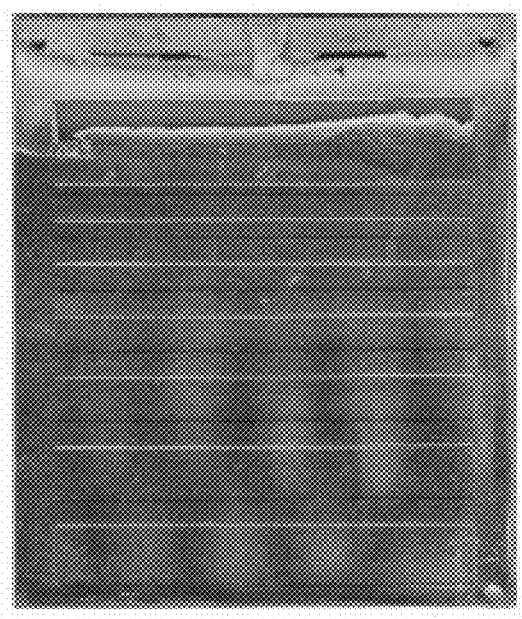
Figure 15:
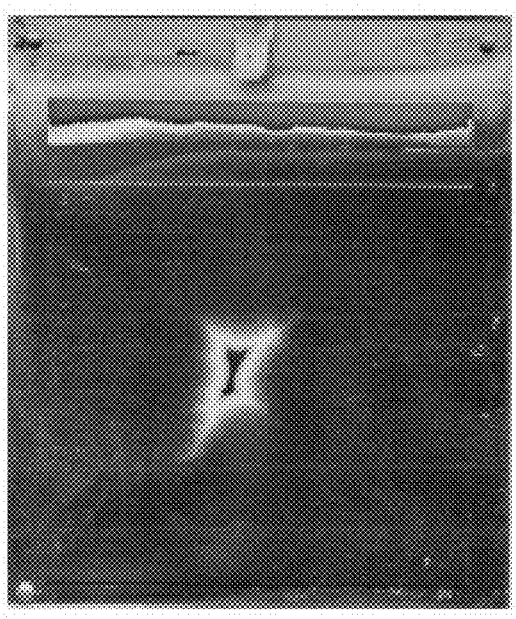
Figure 16:
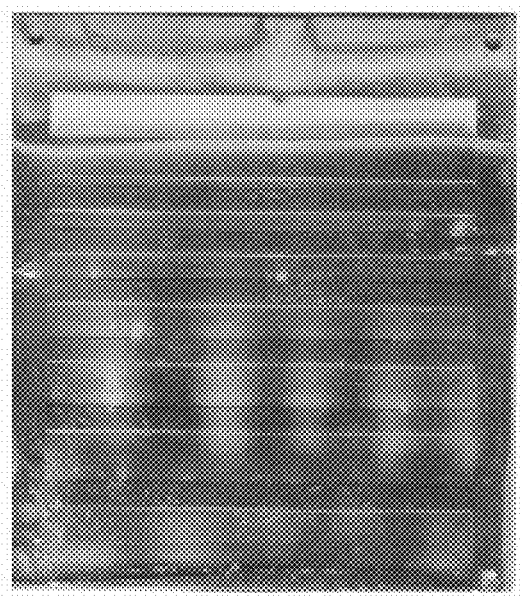
Figure 16:
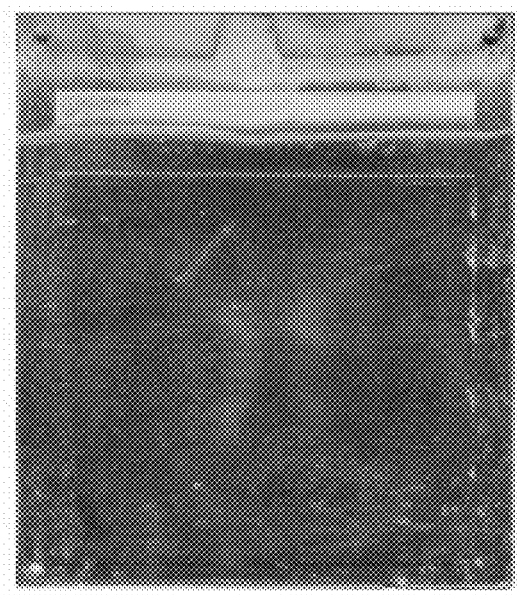

Three substrates are modified with rGO on both sides according to the method of Example 1, to which PVI (1 g/L), PQT-2 (1 g/L), PQT-2 (3 g/L) are respectively applied. FIGS. 8-10 show that the Cu is deposited throughout the front sides and partially over the back sides of the substrates.

Experiment 1 for the Substrate of Example 2

Six substrates are modified with rGO on both sides according to the method of Example 2, to which PVI, PAE, Gemini, PACD, PDACH and PQT-2 are respectively applied. FIGS. 11-16 show that the Cu is deposited almost throughout the front sides and the back sides of the substrates. Particularly, the substrates immersed in the conditioner solutions containing Gemini or PQT-2 perform better in terms of density and uniformity after copper electroplating.

Plating Through Holes with Copper Prepared According to Example 1

A printed circuit board (PCB) is prepared according to the method of Example 1, to which polyamines of 1 g/L or 2 g/L is applied. Thereby the rGO can be grafted on the surfaces and sidewalls of high-aspect through holes in the PCB. The through holes have diameters of 500 μm and 250 μm. Copper seed on the sidewall can be deposited by the electroless copper plating process. Procedures and operating conditions are well known and unrestricted. In this preferred embodiment, the plating solution includes a copper compound (0.6-1.0M), H₂SO₄ (2-4 v/v %), halide ions such as chloride ions (20-90 ppm), polyethylene glycol (PEG, 200 ppm), bis(3-Sufopropy)disulfide (SPS) (1-3 ppm) and one or two levelers such as N-heterocyclic compounds (1-3 ppm).

The copper electroplating is carried out at a current density of 15ASF and at temperature of 28° C. for 1.5 hours. The copper electroplating solution is stirred by air bubbles (3 NL/min).

Figure 17:
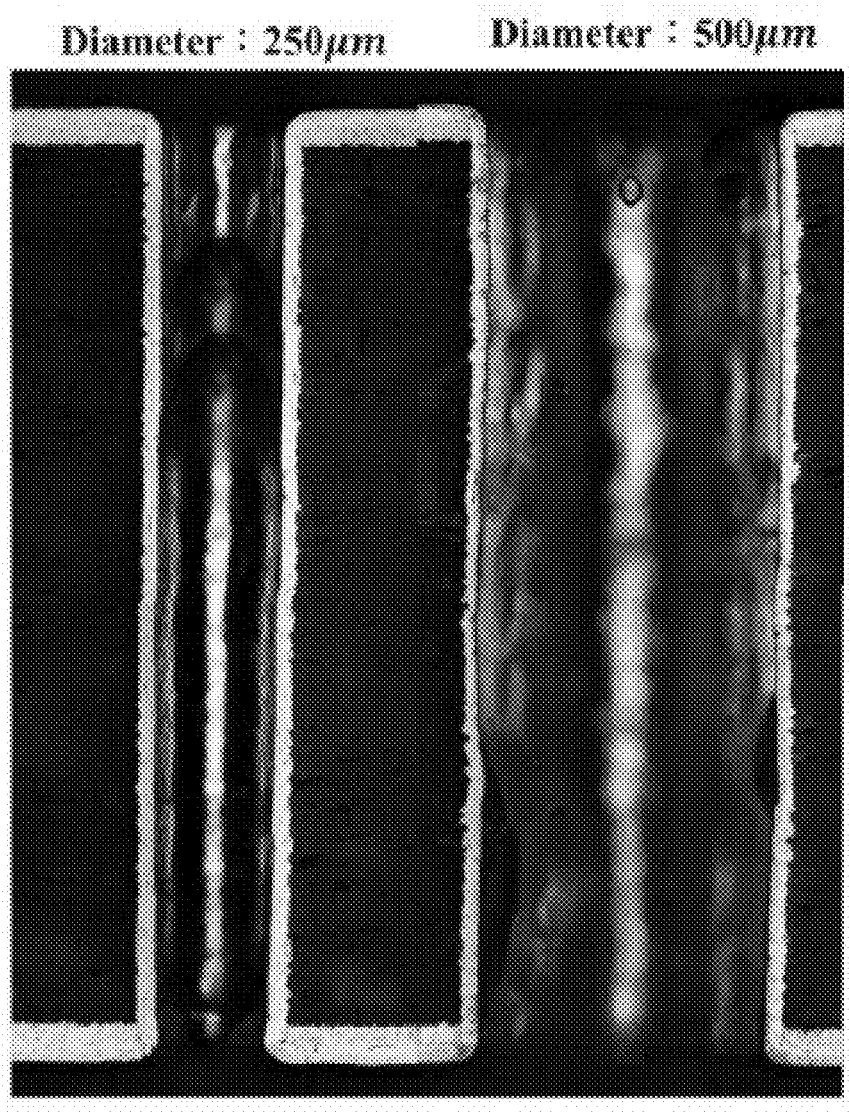
FIG. 17 shows the OM image of the copper plated through hole in the PCB before thermal shock test.

FIG. 17 shows the OM 100× image of the copper-plated through holes after a thermal reliability test. The test is carried out by dipping the plated PCB in a tin stove at 288° C. for 10 seconds and then picking it out for cooling, and repeating such operation for five times. The result shows that the sidewalls of the through holes are densely coated with the copper deposit without void and leak from the sidewalls.

Copper Filling the Blind Vias Prepared According to Example 1

A printed circuit board (PCB) is prepared according to the method of Example 2. The rGO is grafted on the surfaces and sidewalls of high-aspect blind vias of the PCB. The blind vias have a diameter of 50 µm. Copper seed on the sidewall can be deposited by the electroless copper plating process. Procedures and operating conditions are well known and unrestricted. In this preferred embodiment, the copper electroplating solution includes $CuSO_4$ (0.88M), $H_2SO_4$ (3 v/v %), Janus Green B (3 ppm), pyridine variant (1 ppm), polyethylene glycol (PEG, 200 ppm), bis(3-Sufopropy)disulfide (SPS) (6 ppm) and CF (60 ppm). The copper electroplating is carried out at a current density of 20 ASF and at temperature of 20° C. for 60 minutes. The copper electroplating solution is stirred by air bubbles (3 NL/min). Copper is deposited in the blind vias in the manner of bottom-up and superfilling without void.

Figure 18:
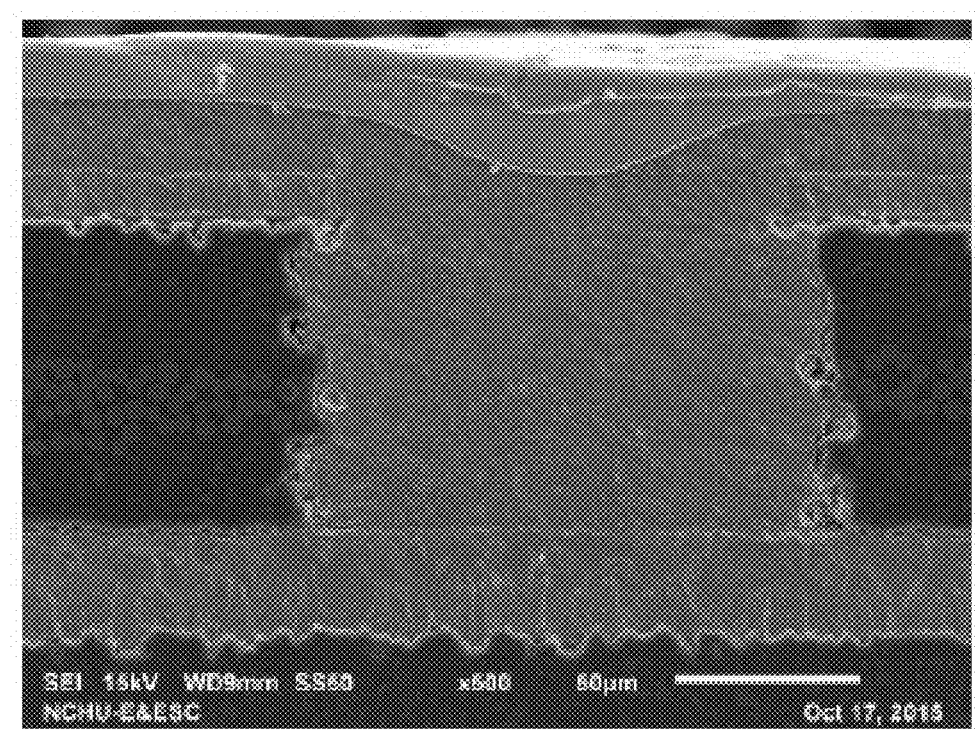
FIG. 18 shows the SEM image of the copper-filled blind via by electroplating after thermal reliability test.

FIG. 18 shows the SEM image of the plated blind via after the thermal reliability test. The test is carried out by dipping the plated PCB in a tin stove at 288° C. for 10 seconds and then picking it out for cooling, and repeating such operation for five times. The result shows that the copper is densely deposited in the blind vias without void and leak from the sidewalls, even after the thermal reliability test.

Plating Through Holes with Copper Prepared According to Example 2

A printed circuit board (PCB) is prepared according to the method of Example 2, whereby the rGO can be grafted on the surfaces and sidewalls of high-aspect through holes in the PCB. Copper seed on the sidewall can be deposited by the electroless copper plating process. Procedures and operating conditions are well known and unrestricted. In this preferred embodiment, the plating solution includes copper ions (0.6-1.0M), $H_2SO_4$ (2-4 v/v %), halide ions such as chloride ions (20-90 ppm), polyethylene glycol (PEG, 200 ppm), bis(3-Sufopropy)disulfide (SPS) (1-3 ppm) and one or two levelers such as N-heterocyclic compounds (1-3 ppm). The copper plating is carried out at a current density of 15ASF and at temperature of 28° C. for 1.5 hours. The copper electroplating solution is stirred by air bubbles (3NL/min).

Figure 19A:
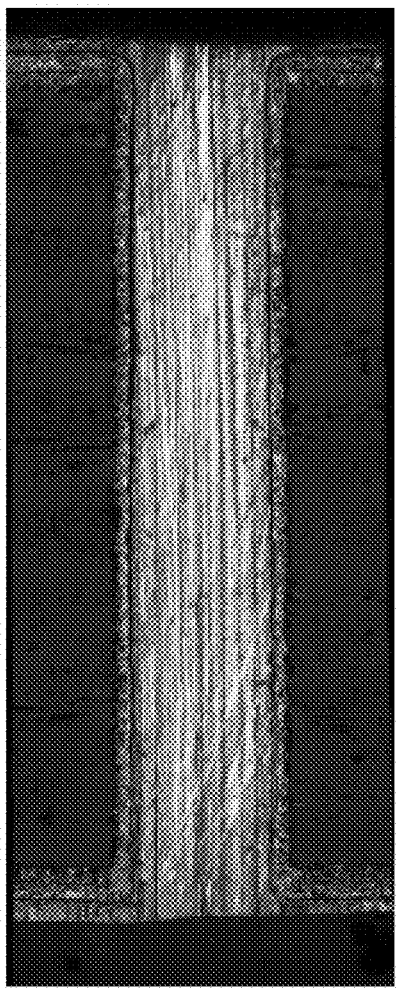
FIGS. 19A, 19B and 19C respectively show the OM 100×, 200 and 500× images of the through hole in the substrate of Example 1 after copper electroplating and the thermal shock test.
Figure 19B:
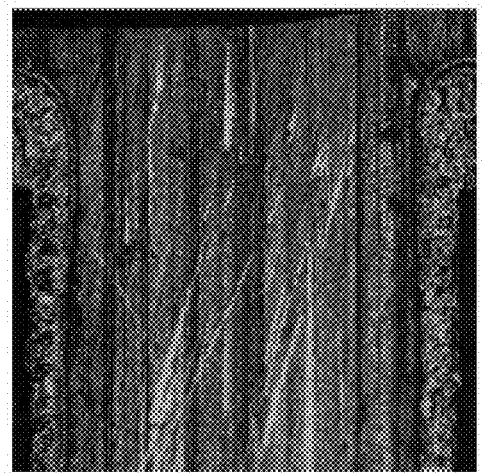
Figure 19C:
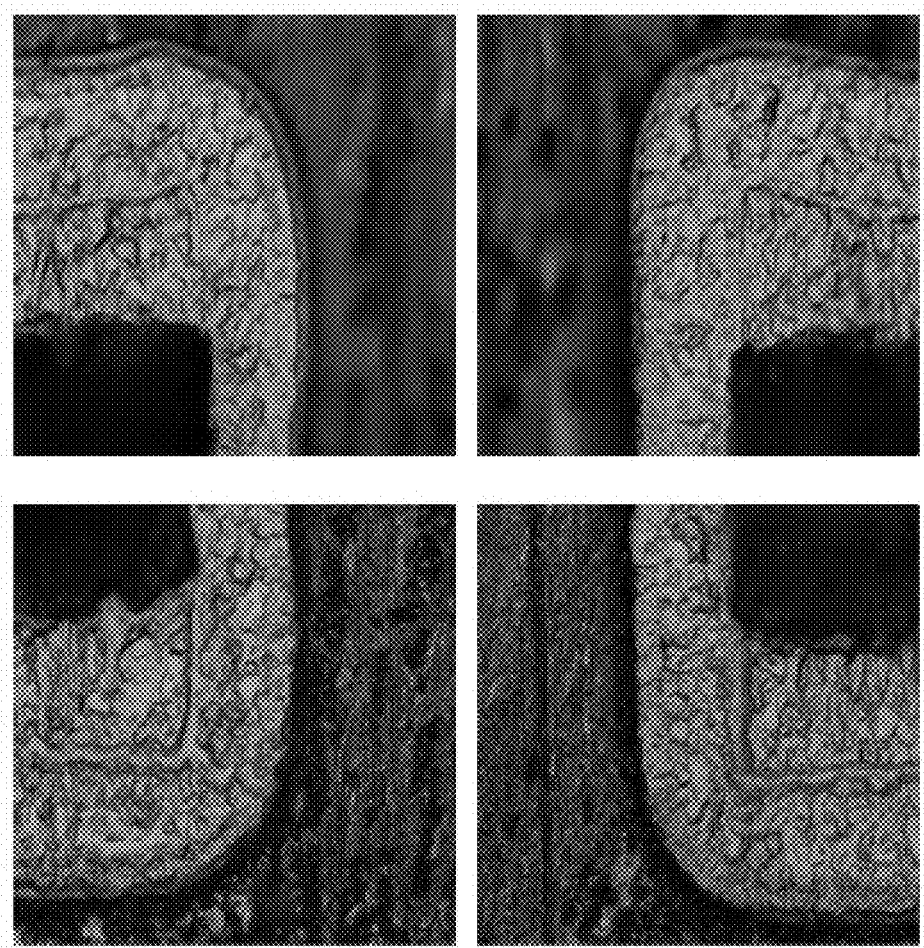

FIGS. 19A, 19B and 19C respectively show the OM 100×, 200 and 500× images of the plated through holes in the substrate of Example 1 after the thermal reliability test. The test is carried out by dipping the plated PCB in a tin stove at 288° C. for 10 seconds and then picking it out for cooling, and repeating such operation for five times. The results show that the sidewalls of the plated through holes are densely coated with copper deposit without void and leak from the sidewalls after the thermal reliability test.

The present invention can be applied to electroplating of surfaces and filling holes of a substrate. The material used for filling holes is not restricted to copper, and can be other conductive metals such as nickel, cobalt and the alloys thereof.

What is claimed is:

1. A method for modifying surfaces of a substrate and sidewalls of high aspect ratio holes of the substrate with reduced graphene oxide (rGO), the method comprising the steps of:
   (a) contacting the substrate with an aqueous solution of a conditioner including an amino compound at 40-80° C. for 3-10 minutes to form layers of the amino compound on surface of the substrate and sidewalls of the holes, wherein the amino compound has a concentration of 0.1-3 g/L;
   (b) contacting the substrate with a graphene oxide (GO) solution for 5-10 minutes to bond the GO with the amino compound, wherein the GO solution has a pH value 3-6, a temperature of 35-80° C. and a solid content of 0.1-1 g/L; and
   (c) contacting the substrate with a solution containing a reducing agent at 60-90° C. for 5-10 minutes to reduce the GO and modify the surfaces of the substrate with the reduced GO (rGO), wherein the solution containing the reducing agent has a pH value 3-10 and a concentration of 0.5-2 M.

2. The method of claim 1, wherein the amino compound is polyamine.

3. The method of claim 2, wherein the polyamine has a structural formula (1):

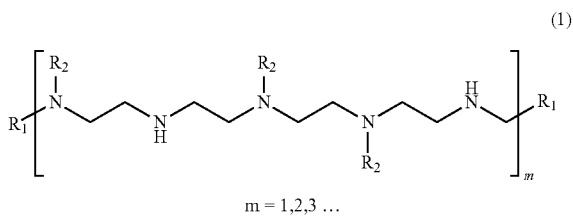

(1)

$m = 1, 2, 3 \ldots$ wherein
$R_1$ is one of formulae (2)-(9)

(2)

(3)

(4)

$n = 2, 4, 6, 8 \ldots$

(5)

(6)

(7)

(8)

(9)

$B = C_{n+1}H_{2n+1}, n = 1, 2, 3 \ldots,$ $R_2$ is one formulae (10)-(14)

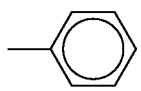 (10)

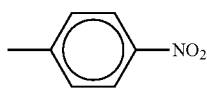 (11)

$C_nH_{2n+1}X$, n = 0,1,2,3 ..., (12)

wherein X of the formula (12) is one of formulae (12-1)-(12-6)

—OH (12-1)

—NH$_2$ (12-2)

—NO$_2$ (12-3)

 (12-4)

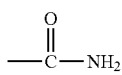 (12-5)

—SH (12-6)

$C_nH_{2n+1}(A)C_nH_{2n+1}(B)$ (13)

n = 1, 2, 3...

wherein A of the formula (13) is one of formulae (13-1)-(13-4), B is one of formulae (13-5)-(13-10)

 (13-1)

 (13-2)

—NH (13-3)

 (13-4)

—OH (13-5)

—NH$_2$ (13-6)

—NO$_2$ (13-7)

 (13-8)

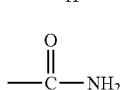 (13-9)

—SH (13-10)

$C_nH_{2n+1}[C_nH_{2n+1}Y]$  n = 1,2,3 ..., (14)

wherein Y of the formula (14) is one of formulae (14-1)-(14-6)

—OH (14-1)

—NH$_2$ (14-2)

—NO$_2$ (14-3)

 (14-4)

 (14-5)

—SH. (14-6)

4. The method of claim 1, wherein the amino compound of step (a) is alkamine.

5. The method of claim 4, wherein the alkamine has a formula (15) or (16)

$NH_{3-m}(C_2H_4)_m(OH)_m$, m=1, 2 or 3 (15)

$N_n(C_2H_4)_{2n+1}(OH)_{2n+1}$, n=2, 3 or 4 (16).

6. The method of claim 1, wherein the amino compound is a polymer having a quaternary ammonium group.

7. The method of claim 6, wherein the polymer having a quaternary ammonium group is selected from the group consisting of quaternary polyvinylimidazole (PVI), polyamidoamine-epichlorohydrin (PAE), hyperbranched gemini quaternary ammonium salt, poly(acrylamide-co-diallyldimethylammonium chloride) (PACD), poly(diallyldimethylammonium chloride) (PDACH), and polyquaternium-2.

8. A method for modifying surfaces of a substrate and sidewalls of blind vias or through holes of the substrate with reduced graphene oxide (rGO), the method comprising the steps of:
(a) contacting the substrate with an aqueous solution containing a conditioner including a polymer with a quaternary ammonium group and alkamine at 40-80° C. for 3-10 minutes to form layers of the polymer having a quaternary ammonium group on surfaces of the substrate and sidewalls of the blind vias or the through holes, wherein the polymer with a quaternary ammonium group has a concentration of 0.5-3 g/L and alkamine has a concentration of 10-50 g/L;
(b) contacting the substrate with a graphene oxide (GO) solution for 5-10 minutes to bond the GO with the polymer having a quaternary ammonium group, wherein the GO solution has a pH value 3-6, a temperature of 35-80° C. and a solid contant of 0.1-1 g/L; and
(c) contacting the substrate with a solution containing a reducing agent at 60-90° C. for 5-10 minutes to reduce the GO and modify the surfaces of the substrate and the sidewalls of the blind vias or the through holes with the reduced GO (rGO), wherein the solution of the reducing agent has a pH value 3-10 and a concentration of 0.5-2 M.

9. The method of claim 8, wherein the alkamine of step (a) has a formula (1) or (2)

$$NH_{3-m}(C_2H_4)_m(OH)_m, \quad m=1, 2 \text{ or } 3 \tag{1}$$

$$N_n(C_2H_4)_{2n+1}(OH)_{2n+1}, \quad n=2, 3 \text{ or } 4 \tag{2}.$$

10. The method of claim 8, wherein the polymer having a quaternary ammonium group is selected from the group consisting of quaternary polyvinylimidazole (PVI), polyamidoamine-epichlorohydrin (PAE), hyperbranched gemini quaternary ammonium salt, poly(acrylamide-co-diallyldimethylammonium chloride) (PACD), poly(diallyldimethylammonium chloride) (PDACH), and polyquaternium-2.

* * * * *